(12) United States Patent
Lin et al.

(10) Patent No.: US 8,873,244 B2
(45) Date of Patent: Oct. 28, 2014

(54) PACKAGE STRUCTURE

(75) Inventors: Pang-Chun Lin, Taichung (TW);
Hsiao-Jen Hung, Taichung (TW);
Chun-Yuan Li, Taichung (TW);
Chien-Ping Huang, Taichung (TW);
Chun-Chi Ke, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 500 days.

(21) Appl. No.: 12/759,117

(22) Filed: Apr. 13, 2010

(65) Prior Publication Data

US 2011/0157851 A1 Jun. 30, 2011

(30) Foreign Application Priority Data

Dec. 28, 2009 (TW) .............................. 98145249 A

(51) Int. Cl.
*H05K 7/02* (2006.01)
*H05K 7/06* (2006.01)
*H05K 7/08* (2006.01)
*H05K 7/10* (2006.01)
*H01L 23/498* (2006.01)
*H01L 25/10* (2006.01)
*H01L 23/31* (2006.01)
*H01L 23/00* (2006.01)

(52) U.S. Cl.
CPC ....... *H01L 25/105* (2013.01); *H01L 2225/1035* (2013.01); *H01L 2225/1088* (2013.01); *H01L 2924/01079* (2013.01); *H01L 2224/48091* (2013.01); *H01L 23/49811* (2013.01); *H01L 2224/97* (2013.01); *H01L 2924/01046* (2013.01); *H01L 2225/1058* (2013.01); *H01L 23/3128* (2013.01); *H01L 2924/3025* (2013.01); *H01L 2224/48247* (2013.01); *H01L 24/48* (2013.01); *H01L 23/49816* (2013.01); *H01L 24/16* (2013.01); *H01L 2224/48227* (2013.01); *H01L 23/49861* (2013.01); *H01L 2924/15331* (2013.01); *H01L 2924/15311* (2013.01)
USPC ........... 361/760; 361/772; 361/774; 361/790; 361/795

(58) Field of Classification Search
USPC .......... 361/760–784, 794–795; 257/700, 668, 257/785–790
See application file for complete search history.

(56) References Cited

U.S. PATENT DOCUMENTS

| 5,830,800 | A | 11/1998 | Lin |
| 5,942,794 | A | 8/1999 | Okumura et al. |
| 6,143,581 | A * | 11/2000 | Johnson et al. ................. 438/26 |
| 6,143,981 | A | 11/2000 | Glenn |
| 6,229,200 | B1 | 5/2001 | McIellan et al. |
| 6,306,682 | B1 * | 10/2001 | Huang et al. .................. 438/107 |
| 6,498,099 | B1 | 12/2002 | McLellan et al. |
| 6,545,332 | B2 * | 4/2003 | Huang .......................... 257/433 |
| 6,770,959 | B2 | 8/2004 | Huang et al. |

(Continued)

*Primary Examiner* — Tuan T Dinh
(74) *Attorney, Agent, or Firm* — Edwards Wildman Palmer LLP; Peter F. Corless; Steven M. Jensen

(57) ABSTRACT

A package structure includes a base body having a first encapsulant and a wiring layer embedded in and exposed from the first encapsulant. The wiring layer has a plurality of conductive traces and a plurality of first electrical contact pads. The first encapsulant has openings for exposing the first electrical contact pads, a chip electrically connected to the wiring layer, and a second encapsulant formed on the base body for covering the chip and the wiring layer, thereby providing an even surface for preventing the encapsulant from cracking when the chip is mounted.

22 Claims, 8 Drawing Sheets

(56) References Cited

U.S. PATENT DOCUMENTS

| | | | |
|---|---|---|---|
| 6,780,676 B2 * | 8/2004 | Igarashi et al. | 438/110 |
| 6,884,652 B2 | 4/2005 | Huang et al. | |
| 2005/0156322 A1 * | 7/2005 | Smith et al. | 257/778 |
| 2007/0164407 A1 * | 7/2007 | Jun et al. | 257/668 |
| 2007/0262439 A1 * | 11/2007 | Huang et al. | 257/692 |
| 2008/0174005 A1 * | 7/2008 | Kubota et al. | 257/700 |

* cited by examiner

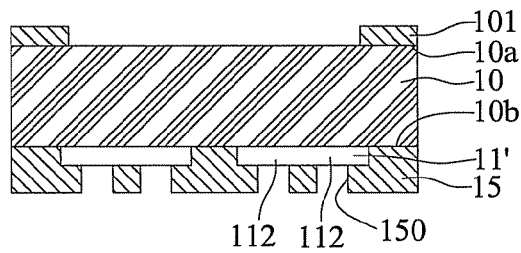
FIG.1A" (PRIOR ART)
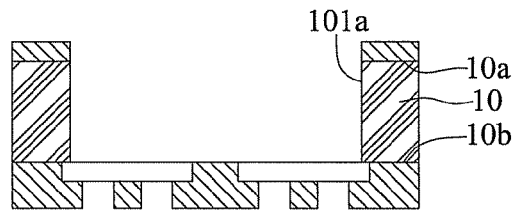
FIG.1B" (PRIOR ART)
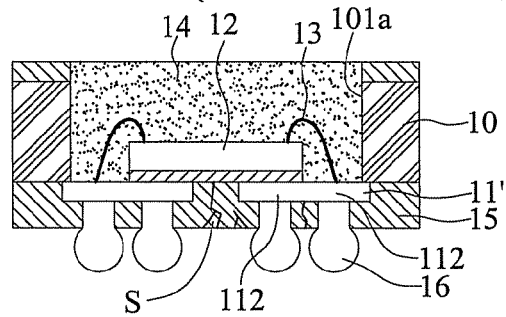
FIG.1C" (PRIOR ART)
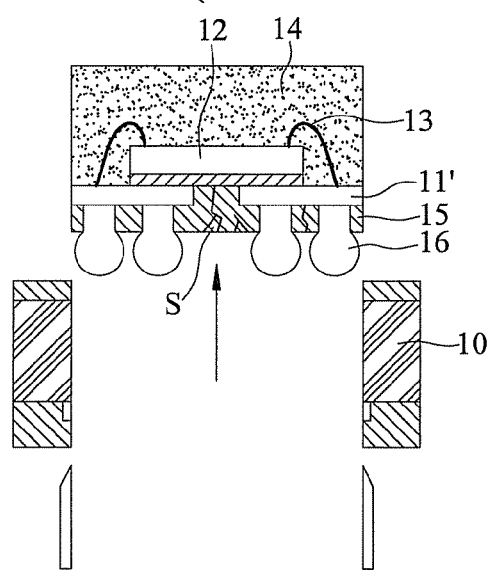
FIG.1D" (PRIOR ART)

PACKAGE STRUCTURE

CROSS-REFERENCE TO RELATED APPLICATIONS

This application claims under 35 U.S.C. §119 (a) the benefit of Taiwanese Application No. 098145249 filed Dec. 28, 2009 the entire contents of which is incorporated herein by reference.

BACKGROUND OF THE INVENTION

1. Field of the Invention

The present invention relates generally to package structures, and more particularly, to a high-quality and low-cost package structure.

2. Description of Related Art

In a conventional lead frame based semiconductor package, such as a QFN (Quad Flat Non-lead) package, a semiconductor chip is adhered to a chip carrier, such as a lead frame, and encapsulated by an encapsulant, and leads of the lead frame are exposed from the encapsulant to serve as I/O connections for electrically connecting the semiconductor chip to an external device, such as a printed circuit board, as disclosed by U.S. Pat. No. 5,942,794, No. 6,143,981, No. 6,229,200 and No. 6,498,099.

In addition, carrier-free packages are developed to reduce package size, as disclosed by U.S. Pat. No. 5,830,800 and No. 6,770,959. FIGS. 1A to 1C show such a carrier-free package. Referring to FIG. 1A, a metal plate 10 made of copper is prepared, and a plurality of electrical contact pads 11 is formed on the metal plate 10 by electroplating. Referring to FIG. 1B, a chip 12 is adhered to the metal plate 10 and electrically connected to the electrical contact pads 11 through bonding wires 13. Then, an encapsulant 14 is formed on the metal plate 10 to cover the chip 12 and the bonding wires 13. Referring to FIG. 1C, the metal plate 10 is removed by etching such that the bottom surfaces of the electrical contact pads 11 are exposed to serve as I/o connections for electrically connecting to an external device.

However, with the metal plate 10 being unfit for routing, lengthy bonding wires are required, thereby increasing the cost and adversely affecting the electrical performance of the package.

Accordingly, U.S. Pat. No. 6,884,652 discloses a carrier-free package that can arrange conductive traces and shorten bonding wires so as to improve the electrical performance of the package. FIGS. 1A' to 1C' show such a carrier-free package. Referring to FIG. 1A', a metal plate 10 made of copper is prepared, and a dielectric layer 100 is formed on the metal plate 10 to allow a plurality of openings to be formed in the dielectric layer 100 to expose portions of the metal plate 10. Referring to FIG. 1B', a wiring layer 11' is formed on the dielectric layer 100 by such as sputtering. The wiring layer 11' comprises a plurality of conductive traces 111, a plurality of electrical contact pads 112 and bond fingers 113 formed at two ends of the conductive traces 111, respectively. Then, a chip 12 is adhered over the dielectric layer 100 and electrically connected to the bond fingers 113 through bonding wires 13. Then, referring to FIG. 1C', an encapsulant 14 is formed over the dielectric layer 100 to cover the wiring layer 11', the chip 12 and the bonding wires 13, and a singulation process is performed. Thereafter, the metal plate 10 is removed by such as etching to expose the bottom surfaces of the electrical contact pads 112. The exposed bottom surfaces of electrical contact pads 112 serve as I/o connections for electrically connecting to an external device.

However, the above-described technique incurs high costs and requires complicated processes and is not suitable for mass production because of the necessity of forming the dielectric layer 100 on the metal plate 10 and forming the wiring layer 11' by such as sputtering.

Accordingly, a semiconductor package that can arrange conductive traces but dispense with a dielectric layer is proposed by U.S. Pat. No. 6,306,682. FIGS. 1A" to 1D" show the semiconductor package.

Referring to FIG. 1A", a metal plate 10 made of copper and having a first surface 10a and an opposed second surface 10b is prepared, an electroplated metal layer 101 and an electroplated wiring layer 11' are formed on the first surface 10a and the opposed second surface 10b of the metal plate 10, respectively. The wiring layer 11' comprises a plurality of electrical contact pads 112. A solder mask layer 15 is further formed on the second surface 10b and the wiring layer 11'. A plurality of openings 150 is formed in the solder mask layer 15 to expose the bottom surfaces of the electrical contact pads 112. The exposed bottom surfaces of the electrical contact pads 112 serve as I/o connections for electrically connecting to an external device. Referring to FIG. 1B', the metal plate 10 is etched, from the first surface 10a of the metal plate 10, to form an open area 101a which penetrates the metal plate 10. As shown in FIG. 1C", a chip 12 is received in the open area 101a such that the chip 12 is adhered to the solder mask layer 15 and electrically connected to the electrical contact pads 112 through bonding wires 13. Further, an encapsulant 14 is formed in the open area 101a to encapsulate the chip 12 and the bonding wires 13, and solder balls 16 are formed on the electrical contact pads 112 in the openings 150. Finally, as shown in FIG. 1D", the package is singulated along the periphery of the open area 101a so as to remove the metal plate 10.

However, in the above-described technique, due to the material characteristics of the solder mask layer 15, it is difficult to form an even surface on the solder mask layer 15. As such, when the chip 12 is adhered to the solder mask layer 15, a crack S can easily occur to the solder mask layer 15 (as shown in FIGS. 1C" and 1D"), thus reducing the product yield. Further, since lithography processes such as mask and exposure processes are required for forming the openings 150 in the solder mask layer 15, it incurs high costs and precludes mass production.

Therefore, it is imperative to overcome the above drawbacks of the prior art.

SUMMARY OF THE INVENTION

In view of the above drawbacks of the prior art, the present invention provides a package structure, which comprises: a base body having a wiring layer and a first encapsulant, wherein the wiring layer has a plurality of conductive traces and a plurality of first electrical contact pads, the first encaspulant has an embedding surface for embedding and exposing the wiring layer and an external surface opposed to the embedding surface and having a plurality of openings for exposing the first electrical contact pads of the wiring layer; a chip electrically connected to the wiring layer; and a second encapsulant formed on the embedding surface for covering the chip and the wring layer.

In the above structure, the first encapsulant and the second encapsulant are made of a polymer material such as an epoxy resin. The wiring layer is made of at least one selected from the group consisting of gold, palladium, and nickel.

The chip is flip-chip connected to the wiring layer or electrically connected to the wiring layer through bonding wires electrically connected to a plurality of bond fingers on the wiring layer.

In an embodiment, a plurality of solder balls or conductive bumps is disposed on the exposed first electrical contact pads, respectively. The base body can further have a die pad embedded beneath and exposed from the embedding surface, wherein the wiring layer is located at the periphery of the die pad, and the chip is disposed on the die pad. Further, a portion of the die pad is exposed from at least one of the openings of the first encapsulant to serve as a second electrical contact pad such that a solder ball or conductive bump is disposed thereon.

The present invention further provides a package structure, which comprises: a base body having a wiring layer and a first encapsulant, wherein the wiring layer has a plurality of conductive traces and a plurality of first electrical contact pads, the first encapsulant has an embedding surface for embedding and exposing the wiring layer and an external surface opposed to the embedding surface and having a plurality of first openings for exposing the first electrical contact pads of the wiring layer; a chip electrically connected to the wiring layer; a plurality of conductive posts disposed on the first electrical contact pads of the embedding surface, respectively; and a second encapsulant formed on the embedding surface for covering the chip, the wring layer and the conductive posts and having a plurality of second openings for exposing the conductive posts, respectively.

In the above structure, the first encapsulant and the second encapsulant are made of a polymer material such as an epoxy resin. The wiring layer is made of at least one selected from the group consisting of gold, palladium, and nickel.

The chip is flip-chip connected to the wiring layer or electrically connected to the wiring layer through bonding wires electrically connected to a plurality of bond fingers on the wiring layer.

Further, a plurality of solder balls or conductive bumps are disposed on the first electrical contact pads in the first openings, respectively. The base body can further have a die pad embedded beneath and exposed from the embedding surface, wherein the wiring layer is located at the periphery of the die pad, and the chip is disposed on the die pad. Further, a portion of the die pad is exposed from at least one of the openings of the first encapsulant to serve as a second electrical contact pad such that a solder ball or conductive bump is disposed thereon.

The conductive posts are made of copper. A plurality of third electrical contact pads are formed on the conductive posts and exposed from the second openings. The third electrical contact pads are made of at least one selected from the group consisting of gold, palladium, and nickel.

According to the present invention, the first encapsulant is formed to cover the wiring layer so as to provide an even surface. As such, when the chip is disposed on the first encapsulant, cracks will not occur to the first encapsulant, thereby preventing the conventional drawbacks caused by the use of a solder mask layer and greatly improving the product quality.

Further, the present invention dispenses with a solder mask layer for covering the wiring layer and accordingly does not require a lithography process for forming openings in a solder mask layer, thus reducing the cost and facilitating mass production.

BRIEF DESCRIPTION OF DRAWINGS

FIGS. 1A' to 1C' are sectional views of another conventional package structure;

FIGS. 1A" to 1D" are sectional views of another conventional package structure;

FIGS. 2A to 2H are schematic views of a package structure according to a first embodiment of the present invention, wherein FIG. 2B is a sectional view of FIG. 2B', and FIG. 2H' shows another embodiment of the package structure depicted in FIG. 2H.

DETAILED DESCRIPTION OF PREFERRED EMBODIMENTS

Figure 1A:
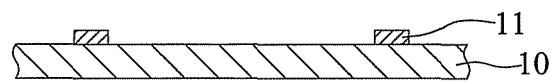
FIGS. 1A to 1C are sectional views of a conventional package structure.
Figure 1B:
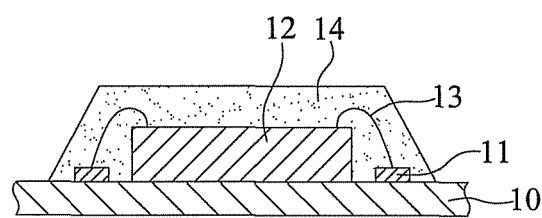
Figure 1C:
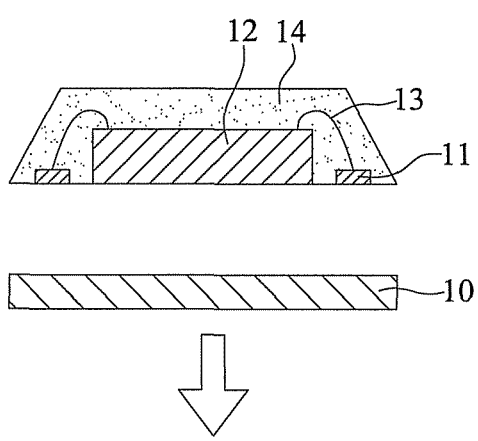
Figure 1A:
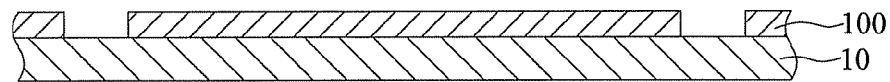
Figure 1B:
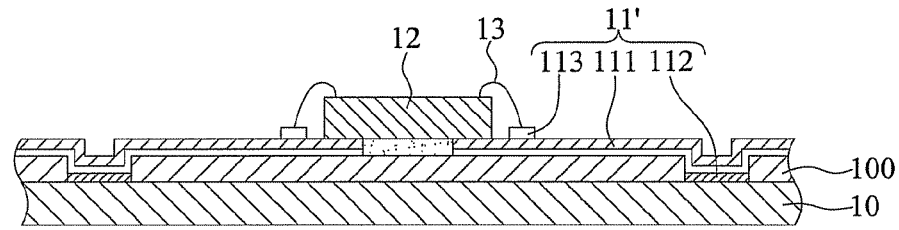
Figure 1C:
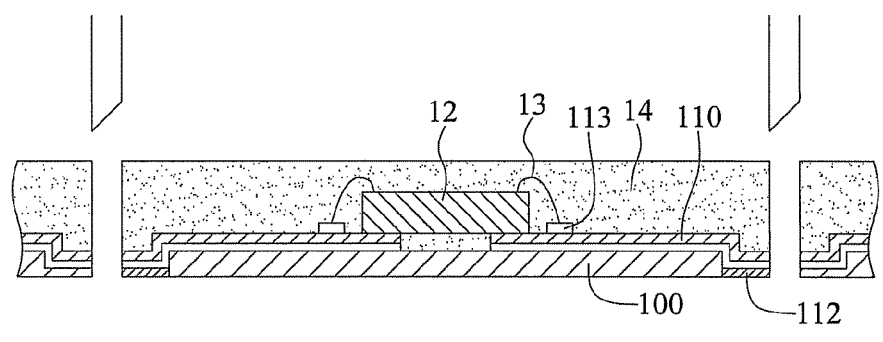
Figure 1C:
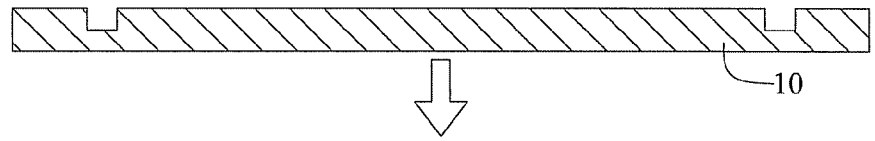

The following illustrative embodiments are provided to illustrate the disclosure of the present invention, these and other advantages and effects can be apparent to those in the art after reading this specification.

First Embodiment

FIGS. 2A to 2H are schematic views of a package structure according to a first embodiment of the present invention. For the purpose of brevity, only one package unit is shown in the drawings. But it should be noted that the present invention is not limited thereto. For example, a plurality of package units arranged in array are provided in practice Referring to FIG. 2A, a metal plate 20 having a first surface 20a and an opposed second surface 20b is provided, and at least an active region A is defined on the metal plate 20. Then, a resist layer 200 such as photo resist is formed on the first and second surfaces 20a, 20b, and a plurality of patterned open areas 200a is formed in the resist layer 200 for exposing portions of the first and second surfaces 20a, 20b of the metal plate 20. Further, a patterned metal layer 201 is formed in the open areas 200a by electroplating, wherein the metal layer 201 on the first surface 20a inside the active region A comprises a die pad 210 and a plurality of wiring layers 21. The metal layer 201 on the first and second surfaces 20a, 20b outside the active region A serve as an anti-etching structure 214 in a subsequent etching process.

In the present embodiment, the metal plate 20 is made of copper, and the die pad 210 and the wiring layers 21 are made of at least one selected from the group consisting of gold, palladium, and nickel. The wiring layers 21 each have a plurality of conductive traces 211, a plurality of first electrical contact pads 212 and bond fingers 213 formed at two ends of the conductive traces 211, respectively, wherein the first electrical contact pad 212 serve as ball pads, as shown in FIG. 2B'.

Figure 2A:
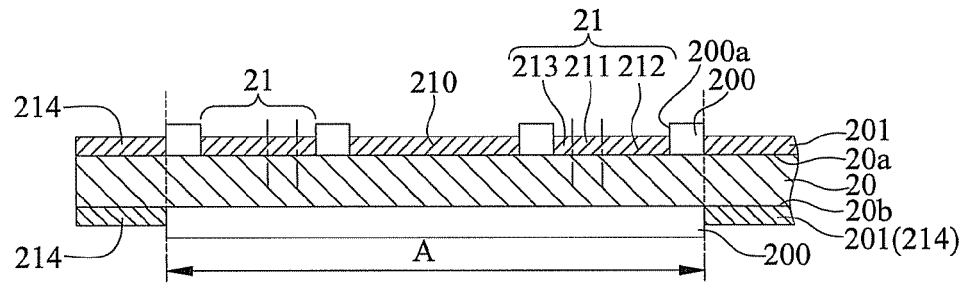
Figure 2B:
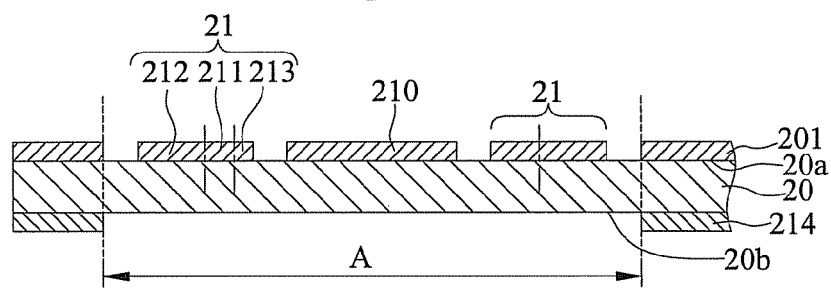
Figure 2B:
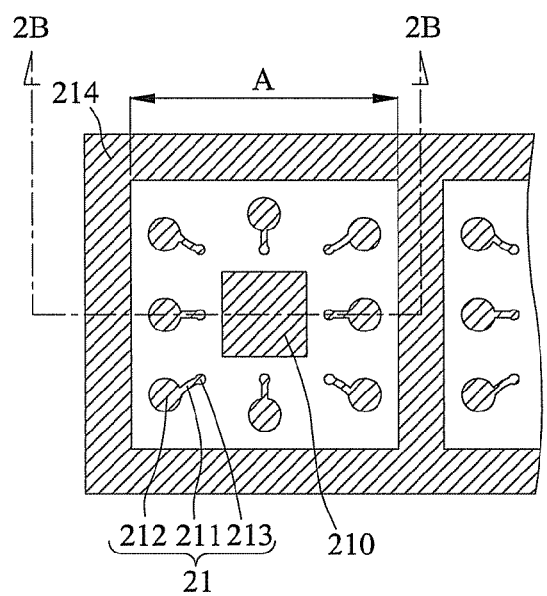

Referring to FIG. 2B, there is shown a sectional view of FIG. 2B', the resist layer 200 is removed to expose portions of the first surface 20a and the second surface 20b in the active region A. Referring to FIG. 2B', the wiring layers 21 are located at the periphery of the die pad 210.

Figure 2C:
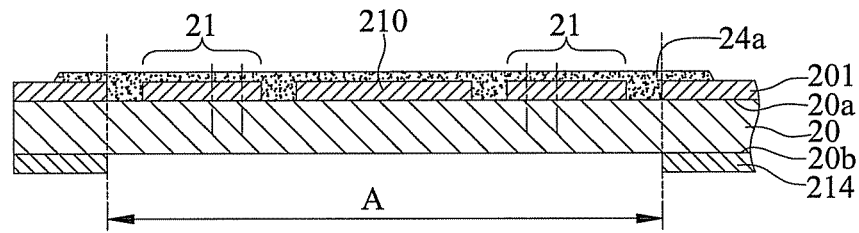

Referring to FIG. 2C, a first encapsulant 24a is formed on the first surface 20a to extend beyond the active region A to cover the die pad 210 and the wiring layers 21, thereby embedding the die pad 210 and the wiring layers 21 in the first encapsulant 24a. The first encapsulant 24a is of a thickness substantially between 0.1 and 0.5 mm, and is made of an epoxy resin polymer material such as EMC (epoxy mold compound), PP (prepeg), ABF (Ajinomoto build-up film) and the like.

Figure 2D:
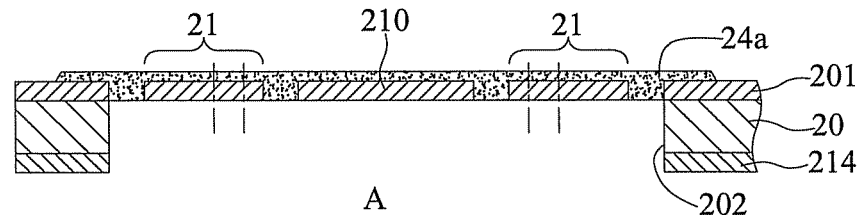

Referring to FIG. 2D, the metal plate 20 is etched from the second surface 20b in the active region A along the edges of the anti-etching structure 214 so as to form an open area 202 penetrating the metal plate 20, and in consequence the die pad 210 and the wiring layers 21 are exposed from the open area 202.

Figure 2E:
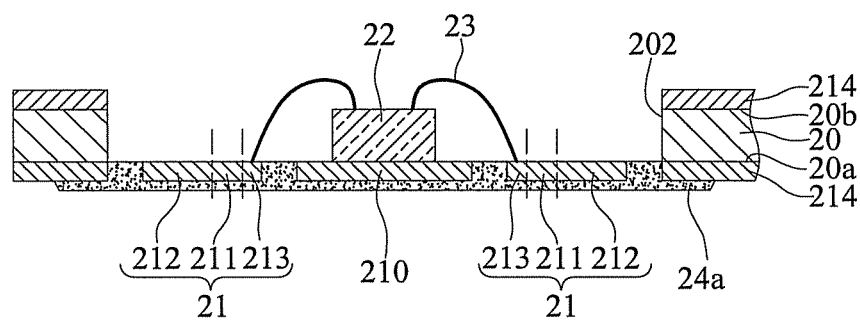

Referring to FIG. 2E, a chip 22 is disposed on the die pad 210 in the open area 202 and electrically connected to the bond fingers 213 of the wiring layers 21 through a plurality of bonding wires 23.

Figure 2F:
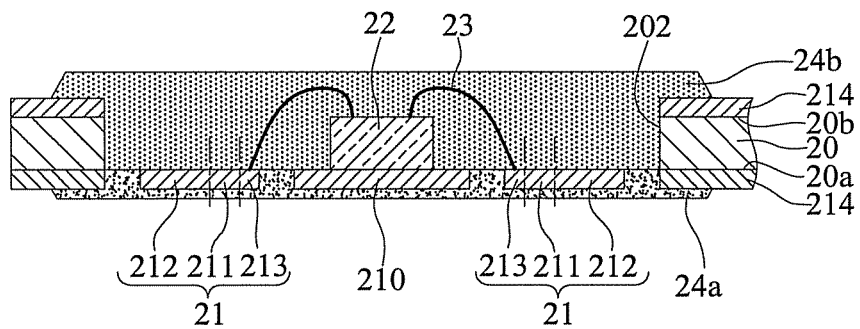

Referring to FIG. 2F, a second encapsulant 24b is formed on the metal plate 20 in the open area 202 to cover the chip 22, the wiring layers 21 and the bonding wires 23 and extend beyond the open area 202. The second encapsulant 24b is made of the same material as the first encapsulant 24a, for example, EMC.

Figure 2G:
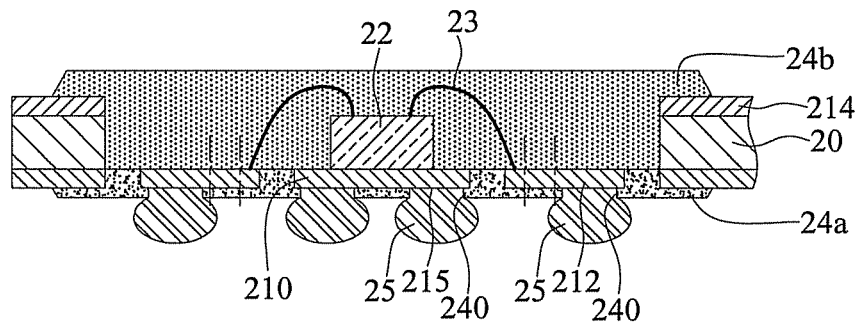

Referring to FIG. 2G, a plurality of openings 240 is formed in the first encapsulant 24a by drilling such that the first electrical contact pads 212 are exposed from the openings 240, wherein the first electrical contact pads 212 are of a width of about 20 μm greater than the diameter of the openings 240. Portions of the die pad 210 are selectively exposed from the openings 240 to serve as second electrical contact pads 215. Conductive elements 25, such as solder balls or conductive bumps, are formed on the first and second electrical contact pads 212, 215 such that a printed circuit board can be mounted on the conductive elements 25.

Figure 2H:
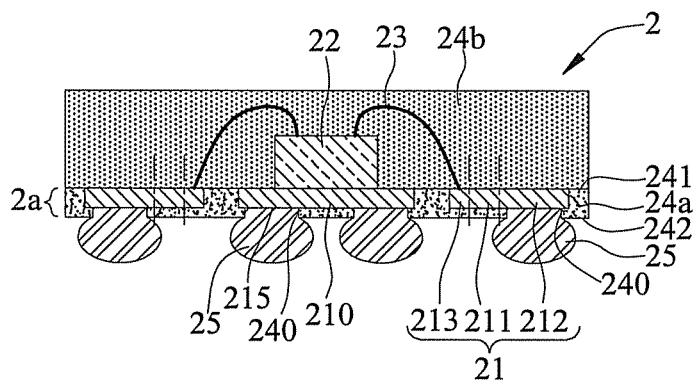
Figure 2H:
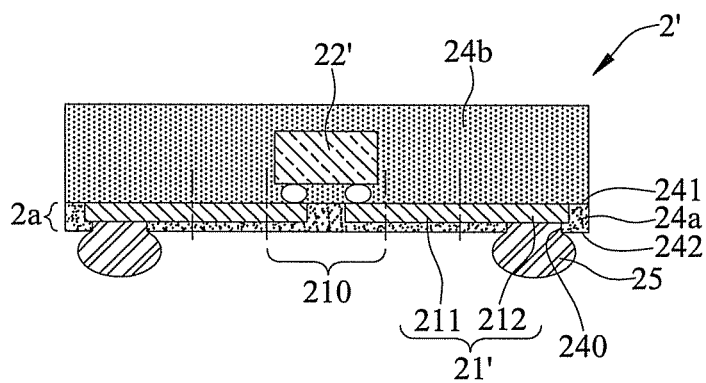

Referring to FIG. 2H, the metal plate 20 is cut and removed so as to form a package structure 2.

In the present embodiment, the first encapsulant 24a is formed to cover the die pad 210 and the wiring layers 21 so as to provide an even surface. As such, when the chip 22 is disposed above the first encapsulant 24a, cracks will not occur to the first encapsulant 24a, thereby preventing the conventional drawbacks caused by the use of a solder mask layer and greatly improving the product quality.

Further, the present invention dispenses with a solder mask layer for covering the die pad 210 and the wiring layers 21 and accordingly does not require a lithography process for forming openings in a solder mask layer, thus reducing the cost and facilitating mass production.

The present invention further provides a package structure 2, comprising: a base body 2a having a first encapsulant 24a, a die pad 210 and a plurality of wiring layers 21; a chip 22 disposed on the base body 2a and electrically connected to the wiring layers 21; and a second encapsulant 24b formed on the base body 2a to cover the wiring layers 21 and the chip 22.

The wiring layers 21 of the base body 2a are located at the periphery of the die pad 210, and has a plurality of conductive traces 211 and a plurality of first electrical contact pads 212. The first encapsulant 24a has an embedding surface 241 and an opposed external surface 242, wherein the die pad 210 and the wiring layers 21 are embedded beneath and exposed from the embedding surface 241 of the first encapsulant 24a, and the external surface 242 of the first encapsulant 24a has a plurality of openings 240 for exposing the first electrical contact pads 212, respectively.

The die pad 210 and the wiring layers 21 are made of at least one selected from the group consisting of gold, palladium, and nickel. Conductive elements 25, such as solder balls or conductive bumps, are disposed on the first electrical contact pads 212 in the openings 240 for electrically connecting to an external device, such as a printed circuit board. Further, portions of the bottom surfaces of the die pad 210 are exposed from the openings 240 to serve as second electrical contact pads 215 for the mounting of conductive elements 25 thereon.

The chip 22 is mounted on the die pad 210 embedded beneath the embedding surface 241 and electrically connected to the wiring layers 21 through bonding wires. Referring to FIG. 2H', a package 2' is shown according to another embodiment, wherein a chip 22' is flip-chip connected to a plurality of wiring layers 21', thereby dispensing with the die pad.

Second Embodiment

FIGS. 3A to 3F are sectional views of a package structure according to a second embodiment of the present invention. The second embodiment differs from the first embodiment in that the conductive posts 36 in the second embodiment are formed for facilitating a stacking process.

Figure 3A:
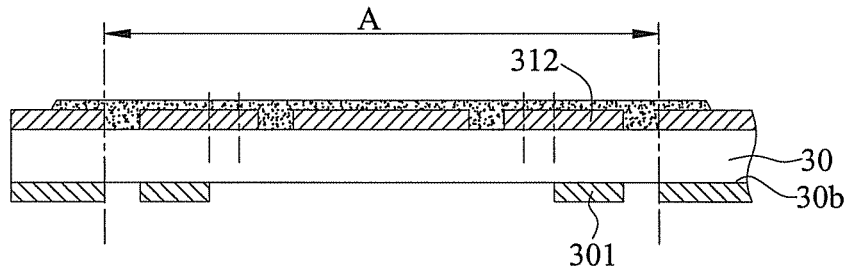
FIGS. 3A to 3F are sectional views of a package structure according to a second embodiment of the present invention.

Referring to FIG. 3A, a metal plate 30 with a structure as shown in FIG. 2C is provided, and a plurality of third electrical contact pads 301 corresponding in position to the first electrical contact pads 312 is formed on the second surface 30b in the active region A.

Figure 3B:
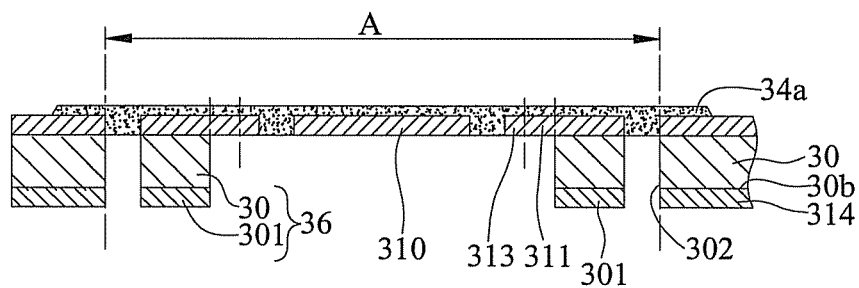

Referring to FIG. 3B, the metal plate 30 is etched from the second surface 30b in the active region A along the inner edges of an anti-etching structure 314 and edges of the third electrical contact pads 301 so as to form an open area 302 to penetrate the metal plate 30, and in consequence the die pad 310, wiring layers 311 and bond fingers 313 are exposed from the open area 302. Therein, the portions of the metal plate 30 located between the first electrical contact pads 312 and the third electrical contact pads 301 corresponding in position thereto are shielded by the third electrical contact pads 301 and thus not etched away during the etching process to thereby form a plurality of conductive posts 36

Figure 3C:
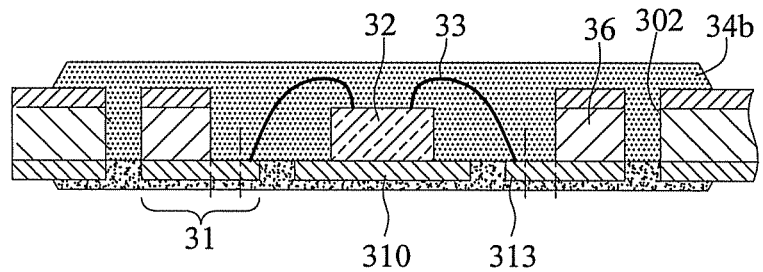

Referring to FIG. 3C, a chip 32 is mounted on the die pad 310 and electrically connected to the bond fingers 313 through a plurality of bonding wires 33; further, a second encapsulant 34b is formed in the open area 302 to cover the chip 32, the conductive posts 36, the wiring layers 31, and the bonding wires 33.

Figure 3D:
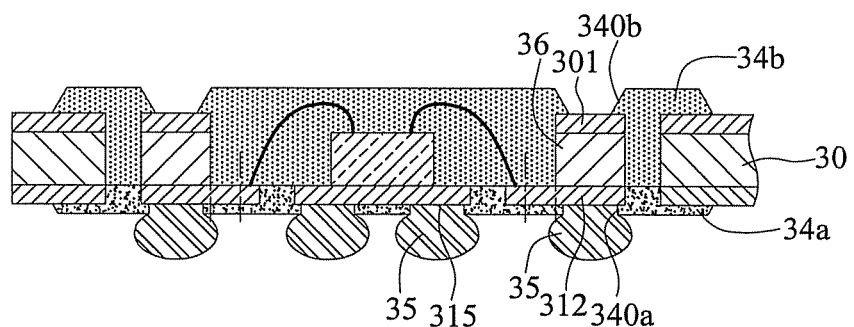

Referring to FIG. 3D, a plurality of first openings 340a is formed in the first encapsulant 34a by laser drilling for exposing the first electrical contact pads 312 and the second electrical contact pads 315. As such, conductive elements 35 can further be formed on the first and second electrical contact pads 312, 315 to allow a printed circuit board to be mounted on the conductive elements 35; meanwhile, a plurality of second openings 340b is formed in the second encapsulant 34b for exposing portions of the third electrical contact pads 301 on the conductive posts 36.

Figure 3E:
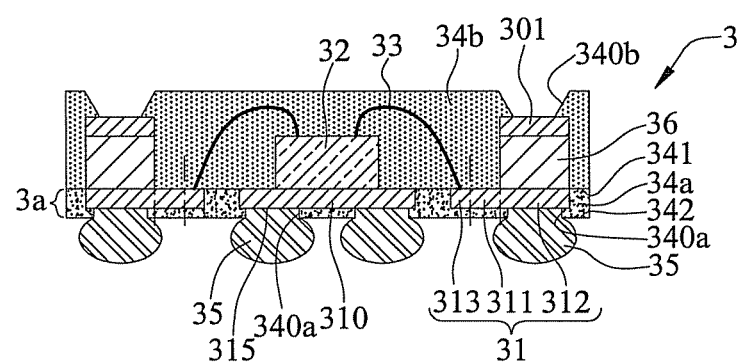

Referring to FIG. 3E, the metal plate 30 is cut and removed to form a package structure 3.

Figure 3F:
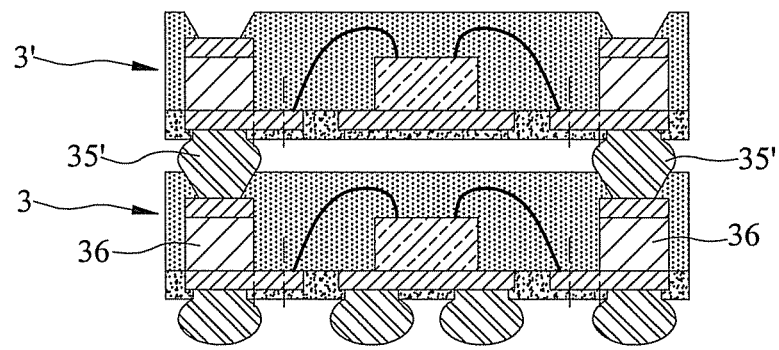

Referring to FIG. 3F, another package structure 3' is stacked on the conductive posts 36 via the conductive elements 35' thereof.

The present invention further provides a package structure 3, comprising: a base body 3a having a first encapsulant 34a, a die pad 310 and a plurality of wiring layers 31; a chip 32 and a plurality of conductive posts 36 disposed on the base body 3a and electrically connected to the wiring layers 31; and a second encapsulant 34b formed on the base body 3a to cover the wiring layers 31, the chip 32, and the conductive posts 36.

The wiring layers 31 of the base body 3a are located at the periphery of the die pad 310, and has a plurality of conductive traces 311 and a plurality of first electrical contact pads 312. The first encapsulant 34a has an embedding surface 341 and an opposed external surface 342 defined thereon. The die pad 310 and the wiring layers 31 are embedded beneath and exposed from the embedding surface 341 of the first encapsulant 34a. The external surface 342 has a plurality of first openings 340a for exposing the first electrical contact pads 312.

The die pad 310 and the wiring layers 31 are made of at least one selected from the group consisting of gold, palladium, and nickel. Conductive elements 35, such as solder balls or conductive bumps, are disposed on the first electrical contact pads 312 in the first openings 340a for electrically connecting to an external device, such as a printed circuit board. Further, portions of the bottom surfaces of the die pad 310 are exposed from the first openings 340a to serve as the second electrical contact pads 315 for the mounting of conductive elements 35 thereon.

The chip 32 is mounted on the die pad 310 embedded beneath the embedding surface 341 and electrically connected to the wiring layers 31. In an embodiment, the wiring layers 31 comprise the bond fingers 313, and the chip 32 is electrically connected to the bond fingers 313 of the wiring layers 31 through bonding wires 33. Alternatively, the chip 32 is flip-chip connected to the wiring layers 31.

The second encapsulant 34b is formed on the embedding surface 341 and has a plurality of second openings 340b for exposing the top surface of the conductive posts 36. The second encapsulant 34b is made of the same material as the first encapsulant 34a, such as EMC.

The conductive posts 36 are disposed on the first electrical contact pads 312 embedded beneath the embedding surface 341 for bonding with conductive elements 35', such as solder balls or conductive bumps, to allow another device, such as another package structure 3', to be mounted on the conductive elements 35'. The conductive posts 36 are made of copper and configured for electrical conduction. The conductive posts 36 further have third electrical contact pads 301 formed thereon and exposed from the second openings 340b, respectively. The third electrical contact pads 301 are made of at least one selected from the group consisting of gold, palladium, and nickel.

According to the present invention, the first encapsulant is formed to cover the wiring layers so as to provide an even surface thereof. As such, when the chip is disposed on the first encapsulant, cracks will not occur to the first encapsulant, thereby greatly improving the product quality.

Further, the present invention dispenses with a solder mask layer for covering the die pad and the wiring layers and accordingly does not require a lithography process for forming openings in a solder mask layer, thus reducing the cost and facilitating mass production.

The above-described descriptions of the specific embodiments are intended to illustrate the preferred implementation according to the present invention but are not intended to limit the scope of the present invention, Accordingly, all modifications and variations completed by those with ordinary skill in the art should fall within the scope of present invention defined by the appended claims.

What is claimed is:

1. A package structure, comprising:
    a base body comprising a wiring layer and a first encapsulant, wherein the wiring layer has a plurality of conductive traces, a plurality of first electrical contact pads, and a plurality of bond fingers, the first encapsulant has an embedding surface for embedding and exposing the wiring layer and an external surface opposed to the embedding surface, the embedding surface is flush with a surface of the conductive traces, the external surface covers the conductive traces, the first electrical contact pads and the bond fingers, the external surface is formed with a plurality of openings for exposing the first electrical contact pads, and the bond fingers are free from being exposed from the external surface;
    a chip disposed on the embedding surface of the first encapsulant and electrically connected to the bond fingers of the wiring layer; and
    a second encapsulant formed on the embedding surface of the first encapsulant for covering the chip and the wiring layer.

2. The structure of claim 1, wherein the first encapsulant is made of one of EMC (epoxy mold compound), PP (prepeg), and ABF (Ajinomoto build-up film).

3. The structure of claim 1, wherein the second encapsulant is made of one of EMC, PP and ABF.

4. The structure of claim 1, wherein the wiring layer is made of at least one selected from the group consisting of gold, palladium, and nickel.

5. The structure of claim 1, wherein the chip is electrically connected to the wiring layer through bonding wires covered with the second encapsulant.

6. The structure of claim 1, wherein a plurality of solder balls or conductive bumps is disposed on the exposed first electrical contact pads, respectively.

7. The structure of claim 1, wherein the base body further has a die pad embedded beneath and exposed from the embedding surface, the wiring layer being located at a periphery of the die pad, and the chip being mounted on the die pad.

8. The structure of claim 5, wherein the bond fingers are electrically connected to the bonding wires.

9. The structure of claim 7, wherein a portion of the die pad is exposed from at least one of the openings of the first encapsulant to serve as a second electrical contact pad, and a solder ball or conductive bump is disposed on the second electrical contact pad.

10. A package structure, comprising:
    a base body comprising a wiring layer and a first encapsulant, wherein the wiring layer has a plurality of conductive traces, a plurality of first electrical contact pads, and a plurality of bond fingers, the first encapsulant has an embedding surface for embedding and exposing the wiring layer and an external surface opposed to the embedding surface, the embedding surface is flush with a surface of the conductive traces and having a plurality of first openings for exposing the first electrical contact pads of the wiring layer;
    a chip disposed on the embedding surface of the first encapsulant and electrically connected to the bond fingers of the wiring layer;
    a plurality of conductive posts disposed on the first electrical contact pads embedded beneath the embedding surface, respectively; and
    a second encapsulant formed on the embedding surface for covering the chip, the wring layer and the conductive posts and having a plurality of second openings for exposing the conductive posts, respectively.

11. The structure of claim 10, wherein the first enbapsulant is made of one of EMC, PP, and ABF.

12. The structure of claim 10, wherein the second enbapsulant is made of one of EMC, PP and ABF.

13. The structure of claim 10, wherein the wiring layer is made of at least one selected from the group consisting of gold, palladium, and nickel.

14. The structure of claim 10, wherein the chip is electrically connected to the wiring layer through bonding wires covered with the second encapsulant.

15. The structure of claim 10, wherein a plurality of solder balls or conductive bumps is disposed on the first electrical contact pads in the first openings, respectively.

16. The structure of claim 10, wherein the base body further has a die pad embedded beneath and exposed from the embedding surface, the wiring layer being located at a periphery of the die pad, and the chip being mounted on the die pad.

17. The structure of claim 10, wherein a plurality of solder balls or conductive bumps is disposed on the conductive posts in the second openings, respectively.

18. The structure of claim 10, wherein the conductive posts are made of copper.

19. The structure of claim 10, wherein a plurality of third electrical contact pads are formed on the conductive posts and exposed from the second openings, respectively.

20. The structure of claim 14, wherein the wiring layer has the plurality of bond fingers electrically connected to the bonding wires.

21. The structure of claim 16, wherein a portion of the die pad is exposed from at least one of the openings of the first encapsulant to serve as a second electrical contact pad so as for a solder ball or conductive bump to be disposed on the second electrical contact pad.

22. The structure of claim 19, wherein the third electrical contact pads are made of at least one selected from the group consisting of gold, palladium, and nickel.

* * * * *